(12) United States Patent  (10) Patent No.: US 7,539,039 B2
Schwerin et al.  (45) Date of Patent: May 26, 2009

(54) INTEGRATED CIRCUIT HAVING A RESISTIVE SWITCHING DEVICE

(75) Inventors: Ulrike Gruening-von Schwerin, Munich (DE); Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 172 days.

(21) Appl. No.: 11/694,393

(22) Filed: Mar. 30, 2007

(65) Prior Publication Data

US 2008/0205118 A1 Aug. 28, 2008

Related U.S. Application Data

(63) Continuation-in-part of application No. 11/680,336, filed on Feb. 28, 2007.

(51) Int. Cl.
*G11C 11/00* (2006.01)
(52) U.S. Cl. .................. 365/148; 365/189.15
(58) Field of Classification Search ............ 365/148, 365/189.15, 214
See application file for complete search history.

(56) References Cited

U.S. PATENT DOCUMENTS

| 6,940,749 B2 | 9/2005 | Tsang |
| 7,355,898 B2 * | 4/2008 | Roehr ............ 365/189.011 |
| 2004/0027907 A1 | 2/2004 | Ooishi |
| 2005/0201146 A1 | 9/2005 | Moore et al. |

FOREIGN PATENT DOCUMENTS

| DE | 10261432 A1 | 12/2003 |
| DE | 102005046426 A1 | 4/2006 |
| DE | 102005040557 A1 | 3/2007 |
| DE | 102007012781 A1 | 10/2007 |

* cited by examiner

*Primary Examiner*—Vu A Le
(74) *Attorney, Agent, or Firm*—Dicke, Billig & Czaja, PLLC

(57) ABSTRACT

An integrated circuit, a memory cell, memory device and method of operating the memory device is disclosed. In one embodiment, an integrated circuit having a resistively switching memory cell includes a bitline electrode and a second electrode having a lower voltage potential than the bitline electrode; a switching active volume and a selection transistor connected in series between the bitline electrode and the second electrode. The second electrode is connected, via a connection transistor, to a third electrode having the same or a lower voltage potential than the second electrode; wherein the second electrode includes a buried electrode at least partially positioned below the bitline electrode and the third electrode.

42 Claims, 12 Drawing Sheets

INTEGRATED CIRCUIT HAVING A RESISTIVE SWITCHING DEVICE

CROSS-REFERENCE TO RELATED APPLICATIONS

This Utility Patent application is a Continuation-in-Part of U.S. patent application Ser. No. 11/680,336, filed Feb. 28, 2007 and is incorporated herein by reference.

BACKGROUND

The invention relates to an integrated circuit having a resistively switching memory cell, in one embodiment a Phase Change Random Access Memory ("PCRAM"), and a memory device including such memory cells. The invention further relates to a method of operating an integrated circuit having a resistively switching memory cell and a method of operating a resistively switching memory device. The invention further relates to a method of manufacturing a memory device.

In the case of conventional memory devices, in particular conventional semiconductor memory devices, one differentiates between functional memory devices (e.g., PLAs, PALs, etc.), and table memory devices, e.g., ROM devices (ROM=Read Only Memory—in particular PROMs, EPROMs, EEPROMs, flash memories, etc.), and RAM devices (RAM=Random Access Memory—in particular e.g., DRAMs and SRAMs).

A RAM device is a memory for storing data under a predetermined address and for reading out the data under this address later. In the case of SRAMs (SRAM=Static Random Access Memory), the individual memory cells consist e.g., of few, for instance 6, transistors, and in the case of DRAMs (DRAM=Dynamic Random Access Memory) in general only of one single, correspondingly controlled capacitive element.

Furthermore, "resistive" or "resistively switching" memory devices have also become known recently, e.g., Phase Change Random Access Memories ("PCRAMs"), Conductive Bridging Random Access Memories ("CBRAMs"), Magnetoresistive Random Access Memories ("MRAM") etc.

In the case of "resistive" or "resistively switching" memory devices, an "active" or "switching active" material—which is, for instance, positioned between two appropriate electrodes—is placed, by appropriate switching processes, in a more or less conductive state (wherein e.g., the more conductive state corresponds to a stored logic "One", and the less conductive state to a stored logic "Zero", or vice versa).

In the case of Phase Change Random Access Memories (PCRAMs), for instance, an appropriate chalcogenide or chalcogenide compound material may be used as a "switching active" material (e.g., a Ge—Sb—Te ("GST") or an Ag—In—Sb—Te compound material, etc.). The chalcogenide compound material is adapted to be placed in an amorphous, i.e. a relatively weakly conductive, or a crystalline, i.e. a relatively strongly conductive state by appropriate switching processes (wherein e.g., the relatively strongly conductive state may correspond to a stored logic "One", and the relatively weakly conductive state may correspond to a stored logic "Zero", or vice versa). Alternatively, a chalcogenide free material may be used.

In the case of the above Conductive Bridging Random Access Memories (CBRAMs), the storing of data is performed by use of a switching mechanism based on the statistical bridging of multiple metal rich precipitates in the "switching active" material. Upon application of a write pulse (positive pulse) to two respective electrodes in contact with the "switching active" material, the precipitates grow in density until they eventually touch each other, forming a conductive bridge through the "switching active" material, which results in a high-conductive state of the respective CBRAM memory cell. By applying a negative pulse to the respective electrodes, this process can be reversed, hence switching the CBRAM memory cell back in its low-conductive state.

Correspondingly similar as is the case for the above PCRAMs, for CBRAM memory cells an appropriate chalcogenide or chalcogenide compound (for instance GeSe, GeS, AgSe, CuS, etc.), or a chalcogenide free material may be used as "switching active" material.

In the case of PCRAMs, in order to achieve, with a corresponding PCRAM memory cell, a change from the above-mentioned amorphous, i.e. a relatively weakly conductive state of the switching active material, to the above-mentioned crystalline, i.e. a relatively strongly conductive state of the switching active material, an appropriate relatively high heating current pulse has to be applied to the electrodes, the heating current pulse resulting in that the switching active material is heated beyond the crystallization temperature and crystallizes ("writing process").

Vice versa, a change of state of the switching active material from the crystalline, i.e. a relatively strongly conductive state, to the amorphous, i.e. a relatively weakly conductive state, may, for instance, be achieved in that—again by an appropriate (relatively high) heating current pulse—the switching active material is heated beyond the melting temperature and is subsequently "quenched" to an amorphous state by quick cooling ("erasing process").

Typically, the above erase or write heating current pulses are provided via respective source lines and bit lines, and respective FET or bipolar access transistors associated with the respective memory cells, and controlled via respective word lines.

To be cost competitive, a small cell size is desired, requiring a high density of the memory cell array. With planar array transistors, or with a transistor where the source/drain contacts are lying in the same horizontal plane (for example: FinFET), the cell size is limited to 6F2 for geometrical reasons.

In order to go below 6F2 for a 1T1R cell, a transistor with vertical current flow is desired, featuring a diffused buried ground plate electrode. However, a diffused plate does not have an unlimited conductance. At the array edges, a ground plate connection can be established via implanted well connections. However, such a wiring inside an array is consuming much area.

Thus, there still exists a need for a memory device including volatile memory cells of a small cell size and compact arrangement.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts.

DETAILED DESCRIPTION

Figure 1:
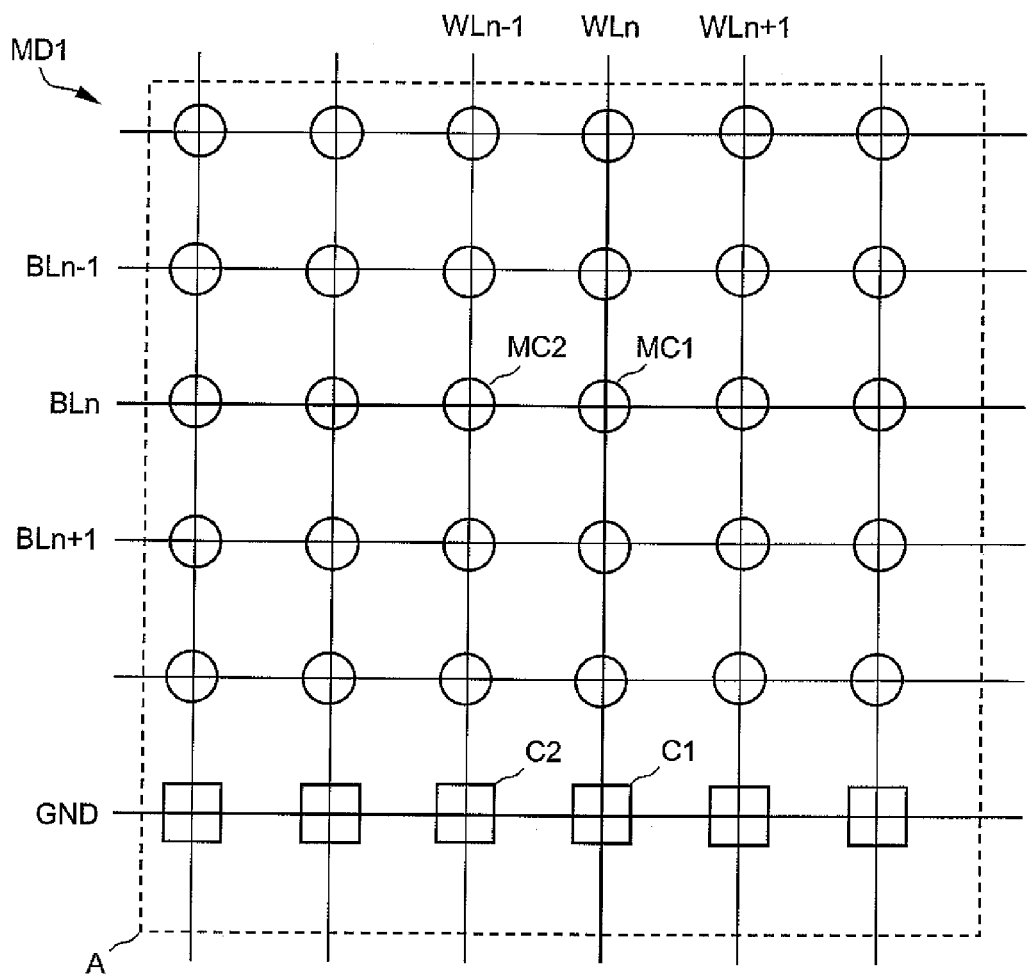
FIG. 1 illustrates a schematic arrangement of a first embodiment of a memory device including a lattice-type array of memory cells.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one or more embodiments, an integrated circuit having a resistively switching memory cell of a memory device includes a bitline electrode and a second electrode having a lower voltage potential than the bitline electrode. A switching active volume and a selection transistor are connected in series between the bitline electrode and the second electrode: wherein the second electrode is connected, via a connection transistor, to a third electrode having the same or a lower voltage potential than the second electrode, and the second electrode includes a buried electrode at least partially positioned below the bitline electrode and the third electrode.

In one embodiment, a wordline is connected to a gate of the selection transistor. The same wordline may be connected to a gate of the connection transistor. Another wordline may be connected to a gate of the connection transistor.

One or more embodiments may include one or more of the following features:

At least one out of the selection transistor and the connection transistor is a vertical transistor at least partially having a substantially vertical current flow. A further switching active volume and the connection transistor are connected in series between the second electrode and the third electrode. The first and third electrodes are positioned above a substrate and the second electrode is positioned within the substrate. The second electrode includes doped silicon. The connection transistor and the selection transistor are at least partially manufactured using the same manufacturing processes. The switching active volume includes a phase change element. The connection transistor is always activated when the selection transistor is activated. The connection transistor is always activated during operation of the memory cell.

According to another embodiment, a memory device includes a plurality of resistively switching memory cells, wherein each of the resistively switching memory cells includes:

a bitline electrode and a second electrode common to the set of memory cells having a lower voltage potential than the bitline electrode;

a switching active volume and a selection transistor connected in series between the respective bitline electrode and the common second electrode;

wherein the common second electrode is connected, via at least one associated connection transistor, to a third electrode having the same or a lower voltage potential than the common second electrode;

wherein the common second electrode includes a buried electrode at least partially positioned below each bitline electrode and the third electrode In one embodiment, for each memory cell: the switching active material includes a phase change element; the selection transistor is connected to a first word line; the active connection includes a transistor that is connected to a second word line; and wherein the selection transistors are each connected to a different first word line.

In one embodiment, a same wordline is connected to a gate of at least one of the selection transistors and a gate of one of the connection transistors. A same wordline is connected to gates of a plurality of the connection transistors. The wordline connected to the gates of the plurality of the connection transistors is different from a respective wordline of associated selection transistors, and wherein the respective wordlines of the associated selection transistors are each different wordlines. At least one out of the selection transistors and the connection transistors is a vertical transistor at least partially having a substantially vertical current flow.

In one or more embodiments, a further switching active volume and the connection transistor are connected in series between the second electrode and the third electrode. The first and third electrodes are positioned above a substrate and the second electrodes are positioned within the substrate. The second electrodes include doped silicon. The connection transistors and the selection transistors are at least partially manufactured using the same manufacturing processes. The switching active volumes include phase change elements. The connection transistors are always activated during operation of the selection transistors. The connection transistors are always activated during operation of the memory device.

According to yet another embodiment, a memory device includes a lattice-type pattern of resistively switching memory cells, wherein the lattice-type pattern is formed by a row of parallel wordlines and by a column of parallel first electrodes substantially perpendicular to the wordlines, each of the resistively switching memory cells including:
  a switching active volume and a transistor connected in series between one of the first electrodes and a second electrode common to the memory cells; and
    wherein each transistor is gated by one of the wordlines;
    wherein at least one of the first electrodes is a bitline and at least one of the first electrodes is a ground electrode having the same or a lower voltage potential than the common second electrodes.

The process of activating the active connection includes the process of:
  activating a transistor such that the transistor selectively allows a current flow between the second and third electrodes.

The transistors connected between the ground electrode and the second electrode are at least activated during operation of one of the resistively switching memory cells connected between a bitline and the second electrode.

In one embodiment, the transistors connected between the ground electrode and the second electrode are always activated.

In one embodiment, the transistors are vertical transistors each at least partially having a substantially vertical current flow.

In one embodiment, the switching active volumes include phase change elements.

In one embodiment, the first and ground electrodes are positioned above a substrate and the second electrode is positioned within the substrate.

According to yet another embodiment, a memory device includes a lattice-type pattern of resistively switching memory cells, wherein the lattice-type pattern is formed by a row of parallel wordlines and by a column of parallel bitlines substantially perpendicular to the wordlines, each of the resistively switching memory cells including: a switching active volume and a transistor connected in series between one of the bitlines and a second electrode common to the memory cells; and wherein each transistor is gated by one of the wordlines; wherein transistors connected between at least one of the wordlines and the second electrode are at least activated during activation of one of the other of the transistor.

In one embodiment, the transistors connected between the at least one of the wordlines and the second electrode are always activated. The transistors are vertical transistors each at least partially having a substantially vertical current flow. The switching active volumes include phase change elements. The bitlines and wordlines are positioned above a substrate, and the second electrode is positioned within the substrate.

The at least one wordline activating memory cells at least during operation of the other of the transistors is manufactured as an electrically continuous line.

According to another embodiment, a method of operating a resistively switching memory cell of a memory device is disclosed, the resistively switching memory cell including:
  a bitline electrode and a second electrode having a lower voltage potential than the bitline electrode;
  a switching active volume and a selection transistor connected in series between the bitline electrode and the second electrode;
    wherein the second electrode is connected, via a connection transistor, to a third electrode having the same or a lower voltage potential than the second electrode;
    wherein the second electrode includes a buried electrode at least partially positioned below the bitline electrode and the third electrode,
  the method including the processes of:
    activating the selection transistor to allow a current flow between the bitline electrode and the second electrode through the switching active volume;
    activating the connection transistor such that it selectively allows a current flow between the second and third electrodes;
  such that, by simultaneously activating the selection transistor and the connection transistor, a current can flow from the bitline electrode to the third electrode.

The activating processes include a simultaneously activating of the selection transistor and the active connection.

The activating of the selection transistor and the active connection of the one of the memory cells is performed by a word line common to the memory cell.

The simultaneously activating the selection transistor and the connection transistor includes permanently activating the connection transistor.

The activating of the selection transistor and the active connection is performed by a same wordline.

The activating of the selection transistor and the active connection is performed by different wordlines.

A current through the transistors is flowing at least partially in a substantially vertical manner.

According to even another embodiment, a method of operating a memory device including a plurality of resistively switching memory cells is disclosed, wherein each of the resistively switching memory cells including:
  a bitline electrode and a second electrode common to the set of memory cells having a lower voltage potential than the bitline electrode;
  a switching active volume and a selection transistor connected in series between the respective bitline electrode and the common second electrode;
    wherein the common second electrode is connected, via at least one associated connection transistor, to a third electrode having the same or a lower voltage potential than the common second electrode;
    wherein the common second electrode includes a buried electrode at least partially positioned below each bitline electrode and the third electrode,
  the method including the processes of:
    activating the selection transistor of one of the memory cells to allow a current flow between the bitline electrode and the common second electrode through the active volume;
    activating the connection transistor of one of the memory cells such that the connection transistor selectively allows a current flow between the second and third electrodes;
  such that by simultaneously activating the selection transistor and the connection transistor of one of the memory cells a current can flow from the bitline electrode to the third electrode.

The simultaneously activating the selection transistor and the connection transistor includes permanently activating the connection transistor.

The activating of the selection transistor and the active connection is performed by a same wordline.

The activating of the selection transistor and the active connection is performed by different wordlines.

A current through the transistors is flowing at least partially in a substantially vertical manner.

According to even another embodiment, a resistively switching memory cell of a memory device includes:

a first electrical connection means and a second electrical connection means having a lower voltage potential than the first electrical connection means;

a switching active means and a selection means for selectively allowing a current flowing through it connected in series between the fist electrical connection means and the second electrical connection means;

wherein the second electrical connection means is connected, via a connection means for selectively allowing a current flowing through it, to a third electrical connection means having the same or a lower voltage potential than the second electrical connection means;

wherein the second electrical connection means includes a buried electrode at least partially positioned below the first electrical connection means and the third electrical connection means.

An electrical control means is connected to a control input of the selection means.

The same electrical control means is connected to a control input of the connection means.

A further electrical control means is connected to a control input of the connection means.

At least one out of the selection means and the connection means forces a substantially vertical current flow.

A further switching active means and the selection means are connected in series between the second electrical connection means and the third electrical connection means.

The first and third electrical connection means are positioned above a substrate and the second electrical connection means is positioned within the substrate.

The second electrical connection means includes doped silicon.

At least one out of the second electrical connection means and the third electrical connection means includes at least one out a group including a buried ground plate, a buried ground line, and a buried ground mesh.

The connection means and the selection means are at least partially manufactured using the same manufacturing processes.

The switching active means includes a phase change element.

The connection means is always activated when the selection means is activated.

The connection means is always activated during operation of the memory cell.

According to yet another embodiment, a method of manufacturing a memory device is disclosed, the memory device including a set of at least two resistively switching memory cells, each of the resistively switching memory cell including:

a bitline electrode and a second electrode common to the set of memory cells having a lower voltage potential than the bitline electrode;

a switching active volume and a selection transistor connected in series between the respective bitline electrode and the common second electrode;

wherein the common second electrode is connected, via at least one associated connection transistor, to a third electrode having the same or a lower voltage potential than the common second electrode;

wherein the common second electrode includes a buried electrode at least partially positioned below each bitline electrode and the third electrode;

wherein the method includes at least one process of simultaneously manufacturing a part of the connection transistor and a functionally correspondent part of the selection transistor.

The connection means is always activated when the selection means is activated.

The method includes the process of simultaneously manufacturing a lower, doped region of the connection transistor and of the selection transistor.

The method includes the process of simultaneously manufacturing a transistor body region of the connection transistor and a transistor body region of the selection transistor.

The method includes the process of simultaneously manufacturing a gate oxide region of the connection transistor and a gate oxide region of the selection transistor.

The method includes the process of simultaneously manufacturing an upper, doped region of the connection transistor and an upper, doped region of the selection transistor.

The method includes the process of simultaneously manufacturing a third electrode part of the connection transistor and a connection region of the selection transistor.

FIG. 1 illustrates a schematic arrangement of an integrated circuit including a first embodiment of a memory device MD1 including a lattice-type array A of memory cells, as indicated by circles. The memory cells are placed in regions where, if viewed top-down, bitlines BL and wordlines WL cross. The bitlines, of which for reasons of clarity only an set BLn−1, BLn, and BLn+1 is provided with reference numbers, are parallel and equally spaced and are substantially perpendicular to the wordlines, of which only an set WLn−1, WLn, and WLn+1 is provided with reference numbers. The wordlines, too, are arranged parallely and are equally spaced. In this view, the bitlines form a column of parallel lines, while the wordlines form a row of parallel lines.

In FIG. 1, an exemplary memory cell MC1 is arranged at a region where the bitline BLn and the wordline WLn cross, and an adjacent memory cell MC2 is arranged at a region where the bitline BLn and the wordline WLn−1 cross. As will be described further below, the bitline BLn provides a voltage potential for addressing (reading and writing) the memory cell, MC1 and MC2, resp., while the associated wordline WLn and WLn−1, resp., acts as a control line for allowing a current to flow through the respective memory cell, MC1 and MC2. All memory cells of the array A are connected by a common second electrode (not illustrated) that has a lower voltage potential $V_2$ than the bitline electrode if the bitline is activated. A memory cell may be comprised of a switching active volume, e.g., a phase change element, and a connection transistor connected in series between one of the bitlines and the second electrode and gated by one of the wordlines.

In known designs, all lines in a column of array A are bitlines BL while all lines in a row are wordlines. Accordingly, all crossing regions includes memory cells. With this known design, the problem arises that—if the second electrode is 'buried' within the substrate—the second electrode may illustrate a too high resistance for long conduction paths and thus reduces a reliability of the switching process of certain memory cells. The second electrode is made from doped substrate material, e.g., doped silicon. The doped silicon may be implemented by all techniques known to the one skilled in the art.

The design illustrated in FIG. 1 overcomes that problem by using one of the lines of the column of lines as a ground electrode GND. Here, the ground electrode GND only needs to have the same or a lower voltage potential $V_{GND}$ than the second electrode, i.e. $V_{GND}<V_2$. By using this ground line GND within the array A of memory cells, the maximum length of a conduction path through the relatively resistive second electrode can be limited. This is especially true if the ground electrode GND is made from metal. Of course, the ground electrode GND may be connected to ground proper.

The connection elements (illustrated as squares) C1, C2 connecting the second electrode with the ground electrode GND may be comprised of a transistor only, which reduces resistance through the connection element C1, C2. This transistor is switched, or gated, by the respective wordline WLn, WLn-1.

In an alternative embodiment, the connection elements C1, C2 may be regular memory cells which facilitates manufacturing because the array layout itself does not need to be changed compared to a known array. Instead, only the connection of the electrode/line to an external circuitry needs to be redesigned. Of course, other connection elements C1, C2 may be used.

Therefore, if an exemplary memory cell MC1 is addressed, especially if switched from one state to the other (i.e., between a conducting state and a less conducting state), the respective bitline BLn is activated by setting it to a relatively high potential. At the same time the wordline WLn is activated such that a current is allowed to flow from the bitline BLn of the relatively high potential through the memory cell to the second electrode of a relatively lower potential. With the wordline WLn activated, the connection element C1 is also activated to allow a current to flow from the second electrode to the ground line GND with its voltage potential equal or preferably smaller than that of the second electrode. As a result, a current flows from bitline BLn through the memory cell MC1—thus switching or reading the memory cell MC1, as desired—to the second electrode at the memory cell MC1, through the second electrode to the connection element C1, and through the connection element C1 to the ground line GND. The length of the current path through the second electrode itself with its relatively high resistivity can thus be set to a desired maximum value.

If the second electrode is a buried electrode that is positioned below the bitline BL and the ground line GND at least at a region where the memory cell MC1 and the connection element C1 is provided, then the current at least partially flows in a vertical direction, i.e., top-down or bottom-up. This is especially true for the case that the memory cell MC1 is placed substantially below the bitline BLn and above the second electrode, and similarly the connection element C1 is placed substantially below the ground line GND and above the second electrode.

Figure 2:
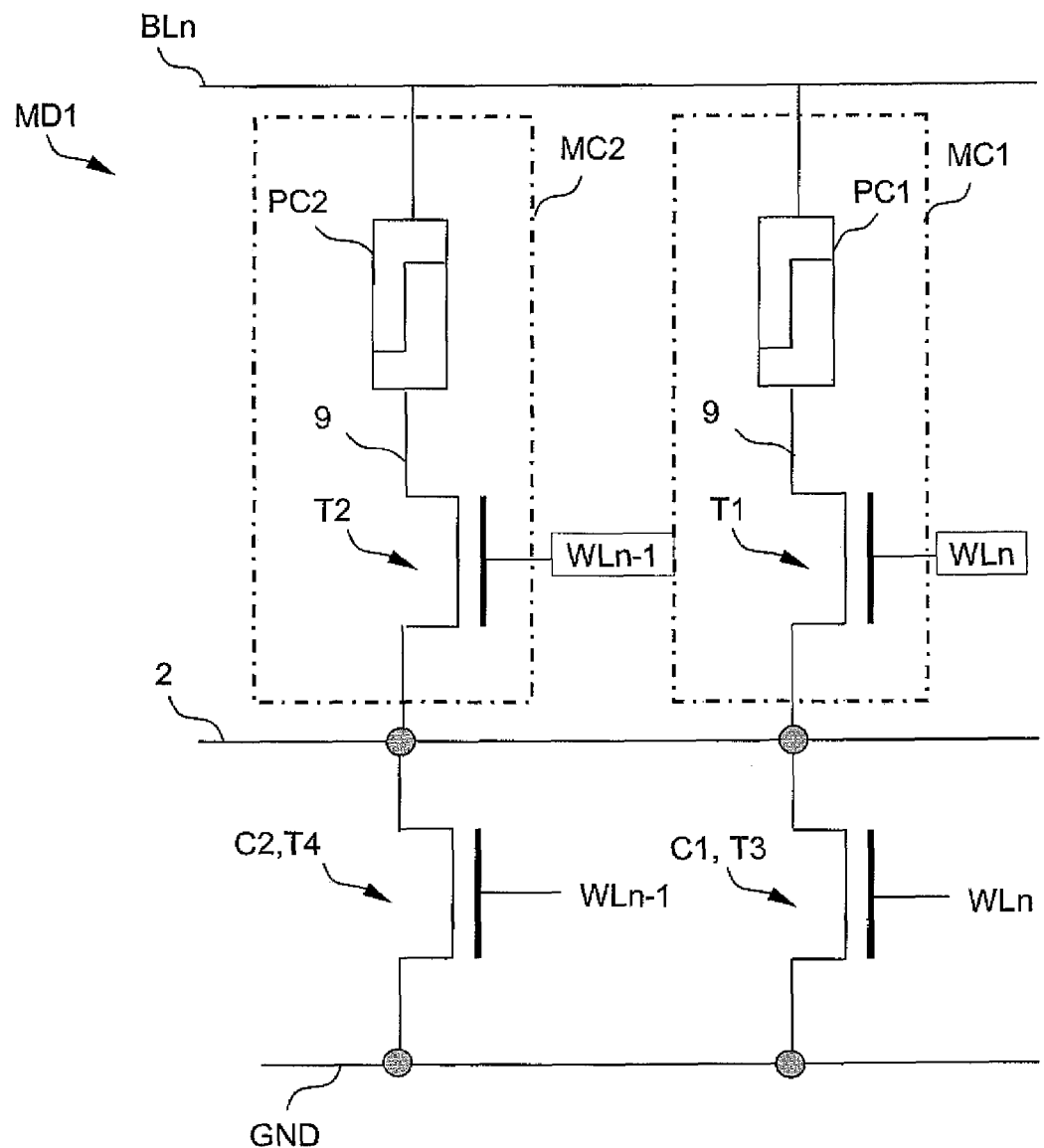
FIG. 2 illustrates an circuitry schematic corresponding to the first embodiment of FIG. 1.

In practice, the number of bitlines and wordlines of an array A, and the number and relative position of the ground line GND is subject to the specific implementation. Also, the layout of the second electrode and of the ground electrode GND may include at least one out a group including a plate, a line, and a mesh. Thus, the buried second electrode may include the form of a buried ground plate, a buried ground line, and/or a buried ground mesh FIG. 2 illustrates an array schematic corresponding to the first embodiment.

Two memory cells MC1, MC2 are connected between a bitline electrode BLn and a second electrode 2. Each memory cell MC1, MC2 includes a switching active material formed by a phase change element PC1, PC2 and a respective selection transistor T1, T2 connected in series. The selection transistor T1, T2 selectively allows a current flow between the bitline electrode BLn and the second electrode 2 through the respective phase change element PC1, PC2 for determining a state of it, i.e., more conducting or less conducting, or reading it. The selection transistor T1, T2 is switched between a current-conducting state (current can flow through the transistor T1, T2) and a current-blocking state (current cannot flow through the transistor T1, T2) by the state of a control line (wordline WLn and WLn-1, resp.), e.g., 'high' or 'low', '1' or '0' etc. that is connected to a gate of the transistor T1, T2. The phase change element PC1, PC2 may be electrically connected to the respective selection transistor T1, T2 via a metal connection 9.

The second electrode 2 is connected to a ground electrode GND via connection transistors T3, T4 that each selectively allow a current flow between the second and ground electrodes 2, GND. The respective connection transistor T3, T4 is switched between a current-conducting state (current can flow through the transistor T3, T4) and a current-locking state (current cannot flow through the transistor T3, T4) by the state of a wordline WLn, WLn-1, e.g., 'high' or 'low', '1' or '0' etc. that is connected to a gate of the connection transistor T3, T4.

In an alternative embodiment, the switching characteristics of the connection transistors T3, T4 may be changed in such a way that they are different from the switching characteristics of the having, for example, different switching thresholds. Especially, the connection transistors T3, T4 may be 'always on', i.e. that they are in a current-conducting state even for low operating voltages, like 0V or ground. That means that the connection transistors T3, T4 conduct a current even if the gate electrode in on a low voltage level, like 0V. The conductivity may be raised from a conductive level to an even more conductive level if the gate electrode is connected to a higher voltage. To differently implement the set of connection transistors T3, T4 and the set of selection transistors T1, T2, one may only need one additional modified implantation process for one of the sets.

When addressing a phase change element PC1, PC2 the associated selection transistor T1, T2 is activated (opened) by the respective word line WLn, WLn-1. While the selection transistor T1, T2 is activated, a current flows through the respective phase change element PC1, PC2 and switches or reads the phase change element PC1, PC2.

At the same time, the associated adjacent transistor T3 and T4, resp., is switched on such that a current coming from the phase change element PC1, PC2 is at least partly directed through the transistor T3 and T4, resp., to the ground electrode GND. This has the advantage that a possible restriction of the current flowing through the phase change element PC1, PC2 because of a limited conductivity of a buried ground electrode 2 can be reduced or eliminated.

Alternatively, the connection transistors can be connected in series with a particular phase change element in the same manner that the selection transistors are connected with their respective phase change elements. In fact, the configuration of the set of the selection transistor and the respective phase change element and the set of the connection transistor and the respective phase change element may be identical. This facilitates designing the memory cell since the whole memory array may be designed identical with only a different wiring, i.e. that the conductive line that is a bitline for memory cells is a ground line for the 'connection cells', i.e. on a relatively lower voltage.

Figure 2A:
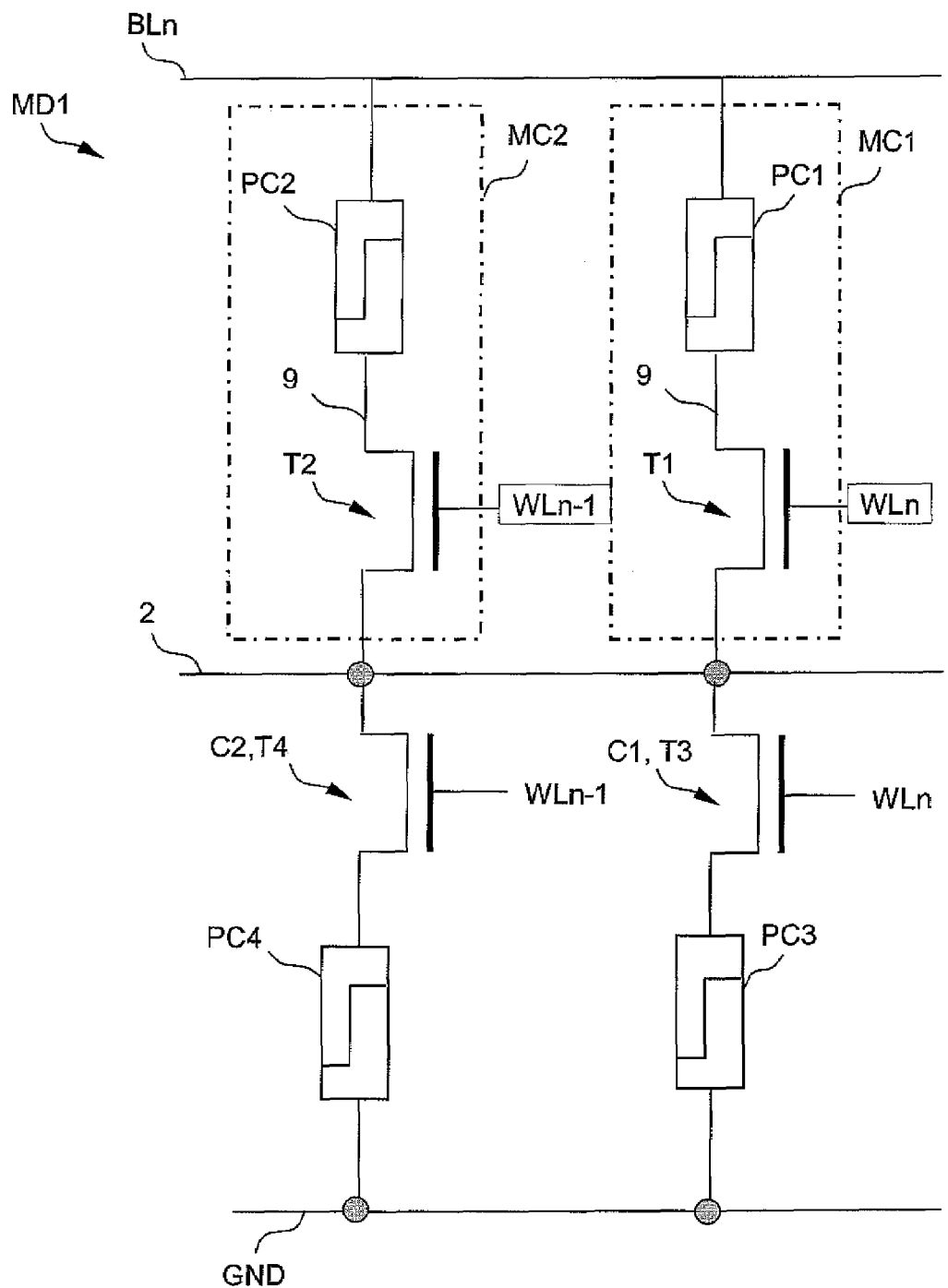
FIG. 2A illustrates an alternative embodiment to the embodiment of FIG. 2.

In FIG. 2A there is illustrated an alternative embodiment of an array schematic wherein now the connection transistors T3, T4 are respectively connected in series to phase change elements PC3, PC4 that are always in a conductive state. While thus the phase change elements PC3, PC4 do not significantly hinder a current flow between the second electrode 2 and ground GND through the connection transistor T3 and T4, resp., (the second electrode 2 and ground GND may be on the same voltage level) they facilitate manufacturing of the memory device because the transistors T1-T4 and associated phase change elements PC1-PC4 may be manufactured using the same processes and resulting in identical or only slightly modified components.

Figure 3:
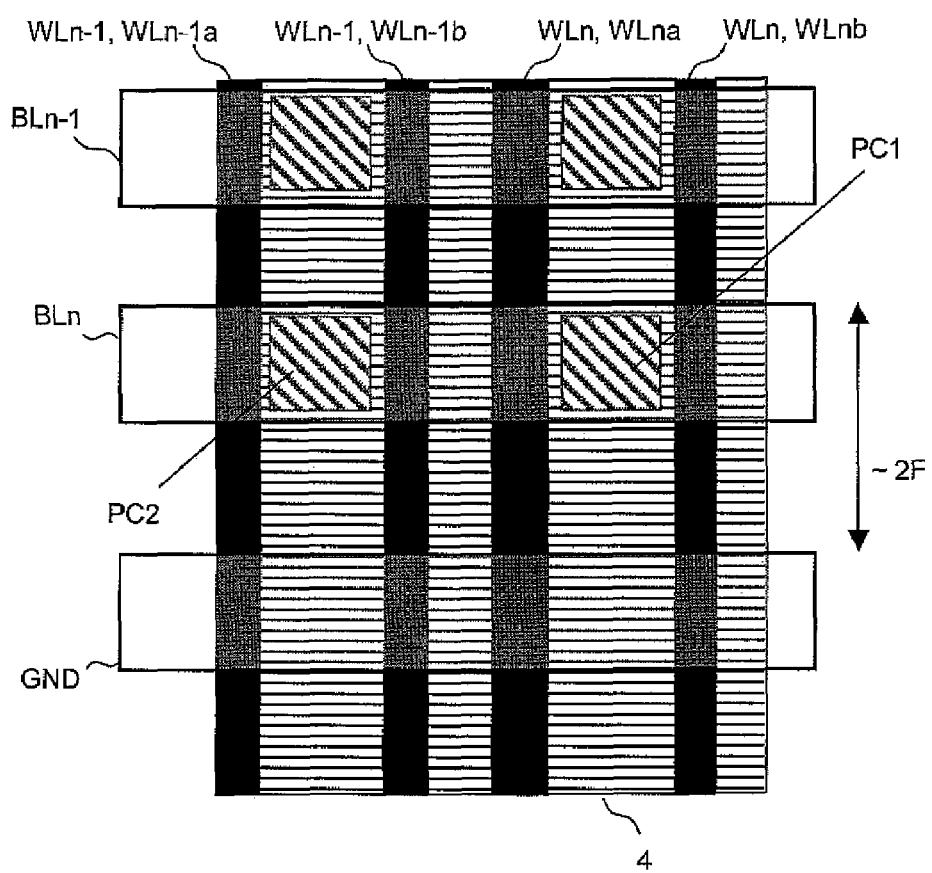
FIG. 3 illustrates an array layout corresponding to the first embodiment of FIG. 1 in a top-down view.

FIG. 3 illustrates a top-down view on several components of the memory device MD1 corresponding to FIG. 1.

Two parallely spaced bitlines BLn, BLn−1 extend from left to right, with a displacement measure of 2 F (F being a structure measure). Two parallely spaced wordlines WLn, WLn−1 extend from top to bottom. Each wordline WLn, WLn−1 is a spacer word line and is comprised of two parallel sublines WLna, WLnb, and WLn−1a, WLn−1b, resp. Between the sublines WLna, WLnb, WLn−1a, WLn−1b is positioned a gate oxide 4. Below the region where the bitlines BLn, BLn−1 cross a gate oxide 4 (as viewed from above) is also positioned a respective phase change element PC1, PC2 (hatched squares).

Parallel to the two bit lines BLn, BLn−1 is positioned a ground line GND. In practice, the bit lines BLn, BLn−1 and the ground line GND are deposited within the same step. Only for reasons of clarity, the ground line GND is positioned next to bitline BLn. In the illustrated embodiment there is no phase change element connected between the ground line GND and the second electrode. In an alternative embodiment, there may be phase change elements placed between the ground line GND and the second electrode, as described below in more detail.

The pattern illustrated in FIG. 3 can be extended, as desired, to form, e.g., an array A of the memory device MD 1.

Figure 4:
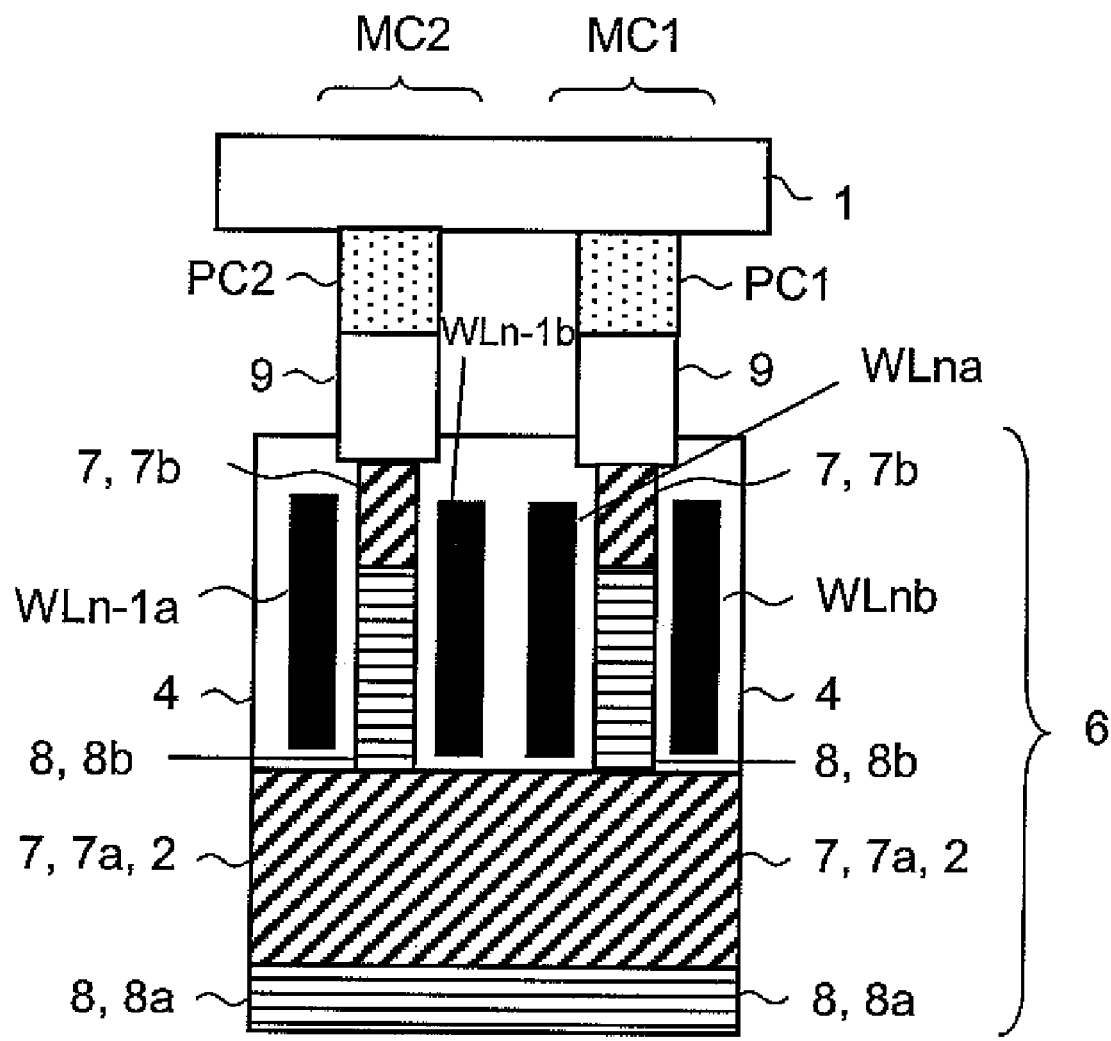
FIG. 4 illustrates a partial cross-section of the array layout of FIG. 3.

FIG. 4 illustrates a cross-section parallel to and through bitline BLn of FIG. 3.

A substrate 6 includes N+ doped regions 7 and relatively weakly doped, or oppositely (N−) doped, regions 8. In particular, on a weakly doped base region 8a is arranged a lower positioned N+ doped region 7a that is plate shaped if viewed from above and acts as a buried ground plate 2. Above the lower positioned N+ doped region 7a continue higher positioned (upper) weakly doped, or oppositely doped, regions 8b (that may be (p) doped) that are separated by a gate oxide 4, also called a transistor body 4. Contained by the gate oxide 4 are the spacer word lines WLna, WLnb, WLn−1a, WLn−1b. Above the upper weakly doped regions 8b are respectively deposited upper N+ doped regions 7b on which, in turn, are deposited metal connection regions 9. On top of the connection regions 9 are deposited respective phase change elements PC1, PC2, above which, in turn, is deposited a common bit line 1.

FIG. 4 illustrates that the connection regions 9 are positioned directly below the phase change elements PC1, PC2 and have approximately the same diameter in a plane parallel to the surface of the substrate 6. Thus a current will flow in a substantially vertical manner (i.e., perpendicular to the surface of the substrate 6 which in this figure is a horizontal plane) through the phase change elements PC1, PC2 and their associated transistors.

Figure 5:
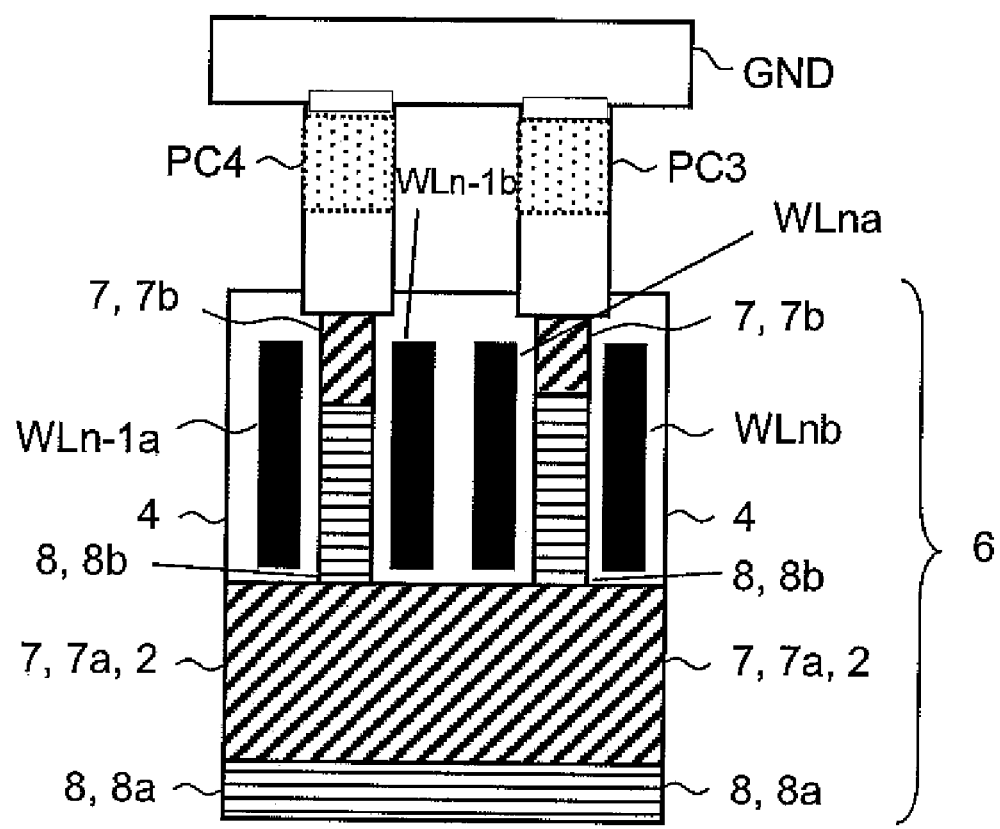
FIG. 5 illustrates another partial cross-section of the array layout of FIG. 3.

FIG. 5 illustrates a cross-section parallel to and through ground line GND of FIG. 3.

This cross-section is similar to the cross-section of FIG. 4 with the exception that in one embodiment the phase change elements are missing and that the ground line GND is directly connected to the upper N+ doped regions 7b.

In an alternative embodiment, the cross-section parallel across the ground line may be identical to the cross-section according to FIG. 4, as indicated be the (optional) phase change elements PC3 and PC4 (indicated by dotted lines) that should allow a current flowing through them whenever the selection transistor is switched on. In other words, these phase change elements PC3, PC4 are in an always conducting state that can be set, for example, at the initial operation, each start-up of the memory device, or in regular intervals.

Figure 6:
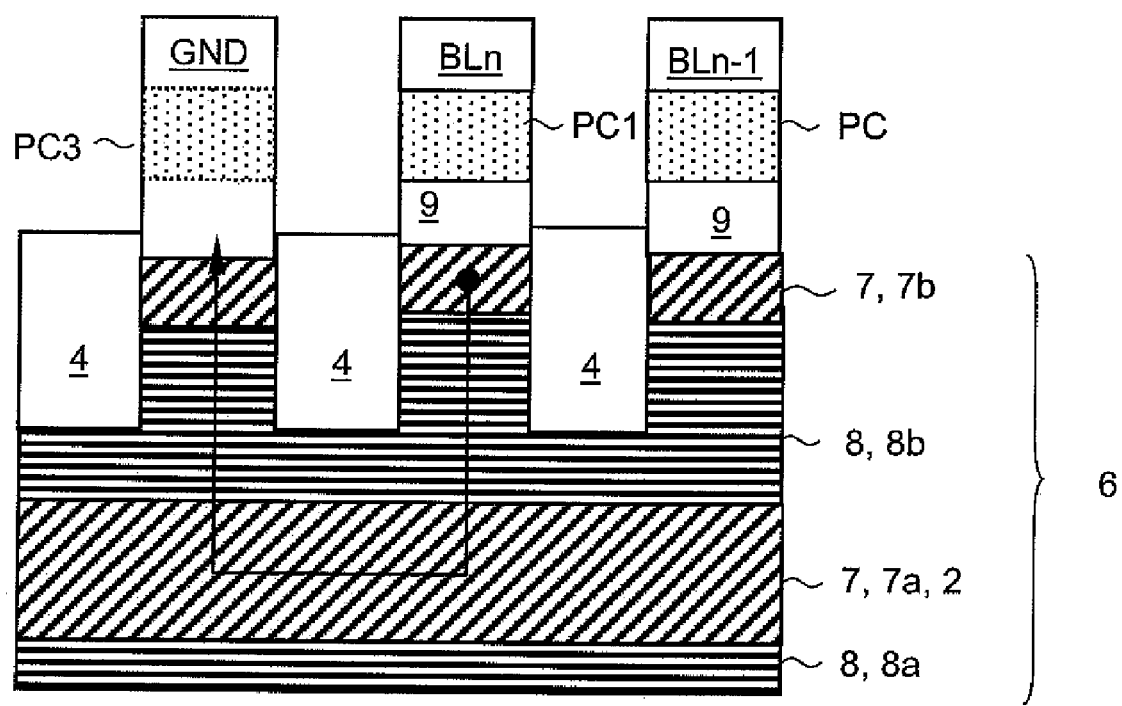
FIG. 6 illustrates yet another partial cross-section of the array layout of FIG. 3.

FIG. 6 illustrates a cross-section of the array layout according to FIG. 3 through the bitlines BLn, BLn−1 and ground line GND between the spacer wordlines WLna, WLnb or WLn−1a, WLn−1b.

FIG. 6 illustrates—in conjunction with FIGS. 4 and 5—that the second electrode 2 is plate shaped and extending below and across the bit lines BLn, BLn−1 and the ground line GND. The optional embodiment showing a phase change element PC3 similar to that of FIG. 4 is also depicted.

In the following, the operation of the memory device of FIGS. 1 to 6 is described in an manner by the operation of the first memory cell MC1. The operation of the other memory cells is similar and is thus not described for reasons of clarity.

If the word line WLn, WLna, WLnb of the first memory cell MC1 is not activated, e.g., by setting it to a predetermined low voltage, no significant current can flow from the upper doped region 7b to the lower positioned doped region 7a/ground plate 2. If the wordline WLn, WLna, WLnb of the first memory cell MC1 is activated, e.g., by setting it to a predetermined higher voltage, a significant current can flow from the upper doped region 7b to the lower positioned doped region 7a/ground plate 2.

The upper weakly doped region 8b thus acts as a transistor-like junction that is switched by the gate oxide 4 that acts as a transistor-like gate. At least the upper doped region 7b, the upper weakly doped (or oppositely doped) region 8b, the gate oxide region 4, and the gate (or gate electrode) constitute a vertical selection transistor that is contacted by one of the metal connection regions 9, the buried ground plate 2.

Since for switching and reading the state of the memory cell MC1 there also exists a respective predetermined voltage difference between the bitline BL and the buried ground plate 2, a current flows through the phase change element PC1 for reading and switching, resp.

In analogy, if the word line WLn, WLna, WLnb is not activated, no significant current can flow from the ground plate (second electrode) 2 to the ground line GND (FIG. 4). Accordingly, if the word line WLn, WLna, WLnb is activated, a significant, vertical current can flow from the ground plate 2 to the metal ground line GND.

All in all, by activating the word line WLn, WLna, WLnb, a current is generated that flows vertically from bitline BLn through the phase change element PC1, through the vertical selection transistor 4, 7b, 8b, to the ground plane 2, and at least partially flows horizontally within the ground plane 2 to the vertical transistor of the active connection between buried ground plate 2 and ground line GND, and from there vertically through this transistor to the ground line GND (as indicated by the arrow in FIG. 6). Since the ground line GND is at least partially positioned on the surface of the substrate 6 it can easily be contacted.

Figure 7:
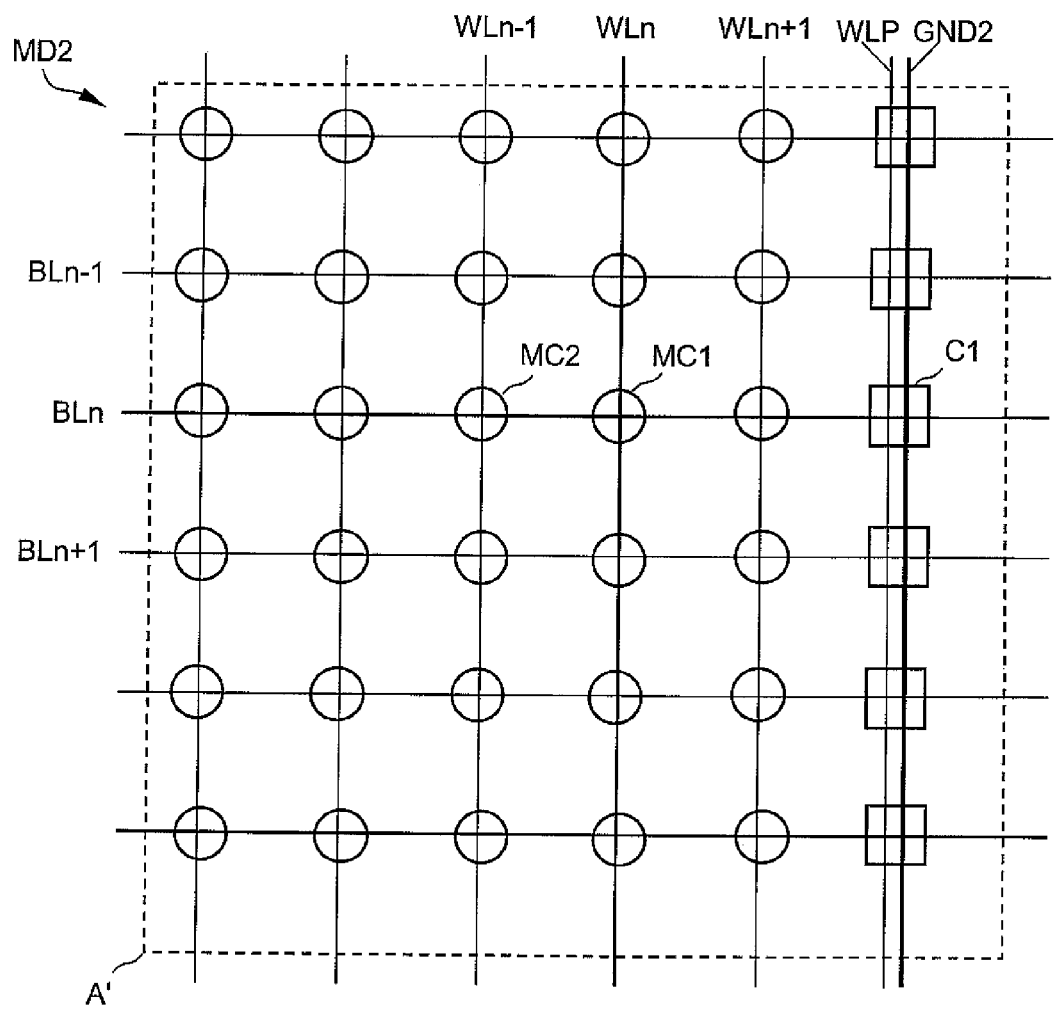
FIG. 7 illustrates a schematic arrangement of a second embodiment of a memory device including another lattice-type array of memory cells.

FIG. 7 illustrates a schematic arrangement similar to FIG. 1 of a second embodiment of a memory device MD2 including another lattice-type array A' of memory cells, as indicated by circles, and connection elements, as indicated by squares. In contrast to the arrangement of FIG. 1, an additional ground line GND parallel to a wordline WL is now introduced at he connection elements (indicated as squares). The connection elements that are connected to the additional ground line GND are all activated by the same word line WLP. In contrast to that, all lines perpendicular to the wordlines are regular bitlines, e.g., BLn, Bln+1, BLn−1, that are connected to the respective memory cells but not to the connection elements C1. Thus all memory cells MC1, MC2 of the array share the same connection element C1.

Figure 8:
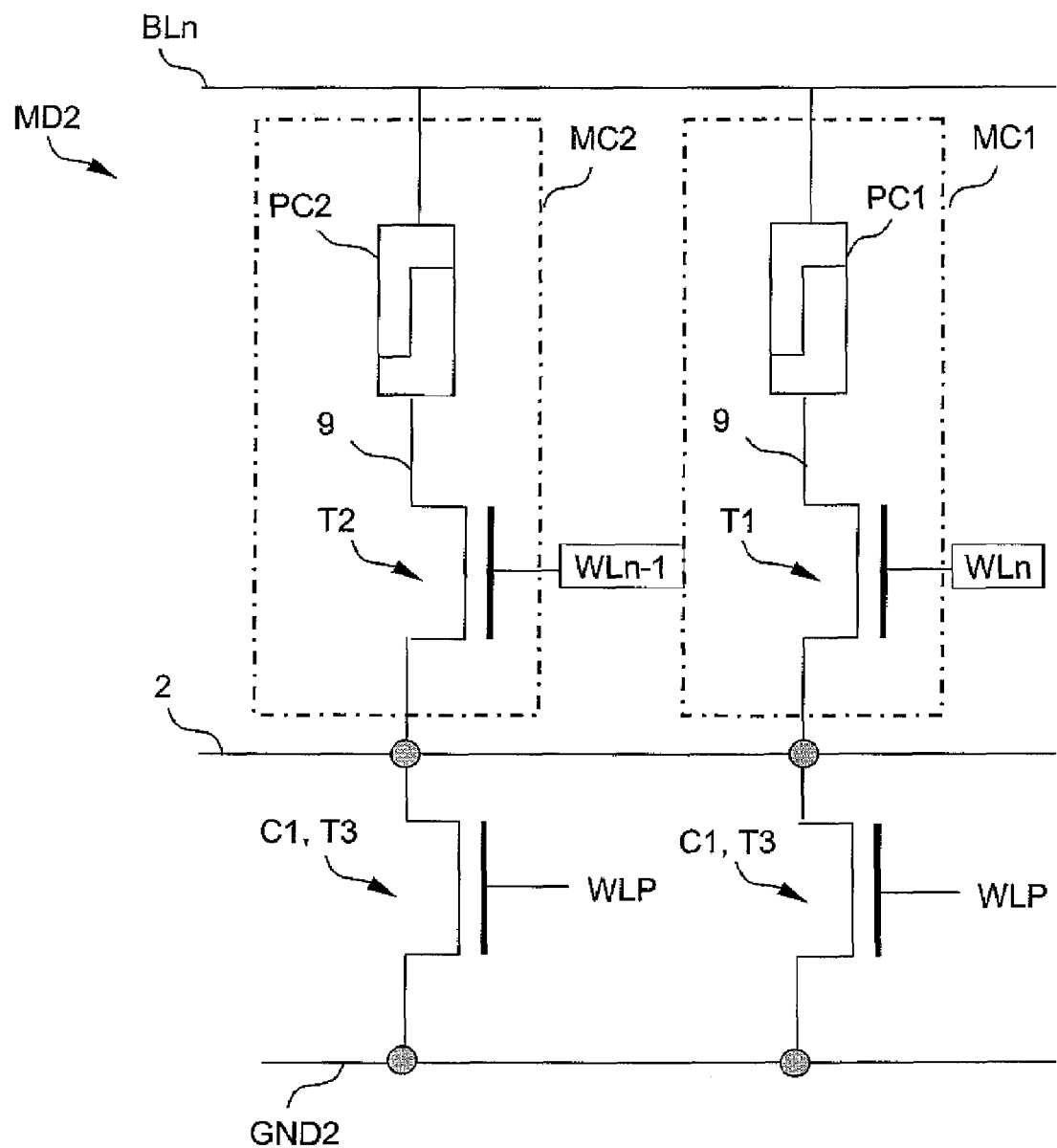
FIG. 8 illustrates an circuitry schematic corresponding to the second embodiment of FIG. 7.

FIG. 8 illustrates an array schematic of the second embodiment FIG. 7.

The array schematics of FIG. 8 differs from the array schematics according to FIG. 2 in that the memory cells MC1, MC2 share the connection element C1 formed by transistor T3 between the second electrode 2 and the ground line GND2. All connection transistors of the array A' are now activated by a common word line WLP that is different from the word lines WLn, WLn−1 gating a respective selection transistor T1, T2 of the set of memory cells MC1, MC2.

Figure 9:
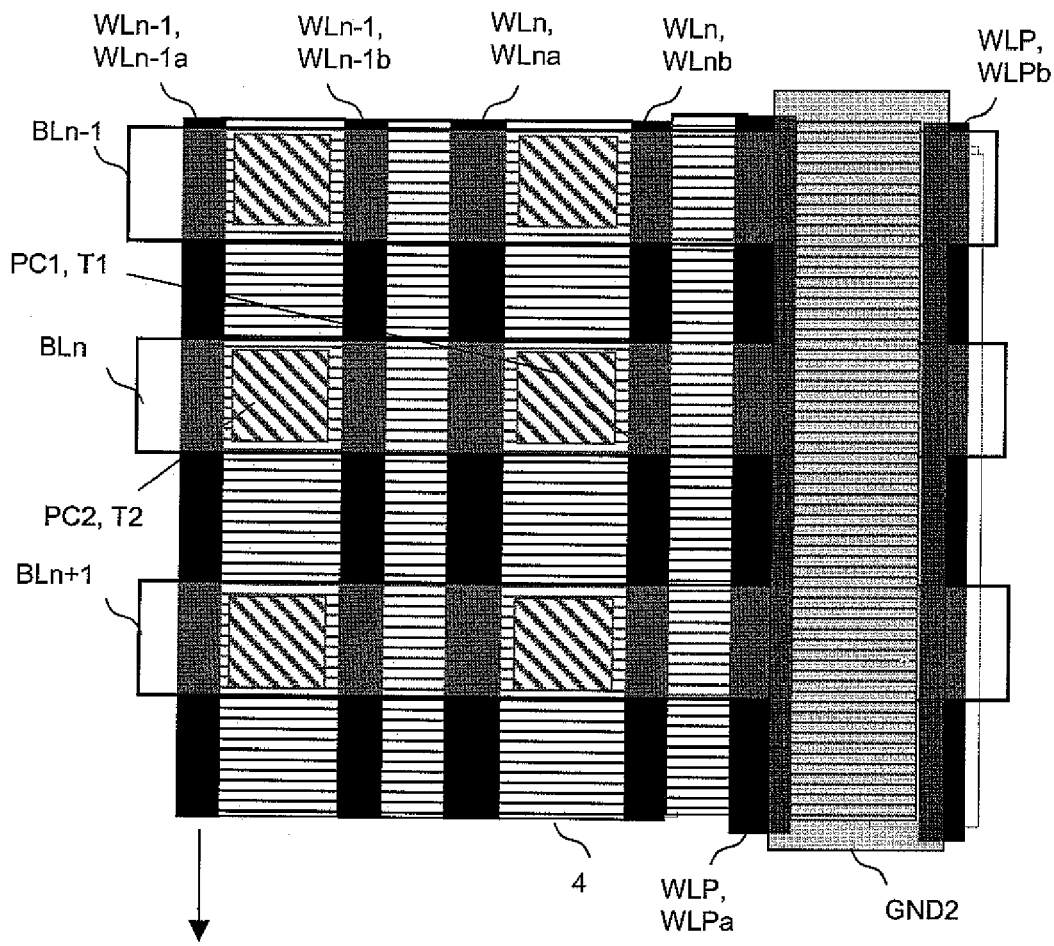
FIG. 9 illustrates an array layout corresponding to the second embodiment of FIG. 7 in a top-down view.

FIG. 9 illustrates a an array layout corresponding to the second embodiment of FIG. 7 in a top-down view.

Compared to the array layout of FIG. 3, in the array layout of FIG. 9 an additional ground line GND2 extends parallely to the wordlines WLn, WLn−1 (i.e. top-bottom in this view), specifically it is at least partially disposed above a plate word line WLP that in turn includes two spacer word lines WLPa, WLPb. The wordlines WLn, WLn−1, WLP are of identical characteristic and are arranged in a regular pattern. Accordingly, the ground line GND2 also extends across the bit lines BL. The illustrated array layout A' can be extended in horizontal and vertical directions, as desired. Also, in comparison to FIG. 3, the—in this view—horizontally extending lines are all used as bitlines BL, not as ground lines.

Figure 10:
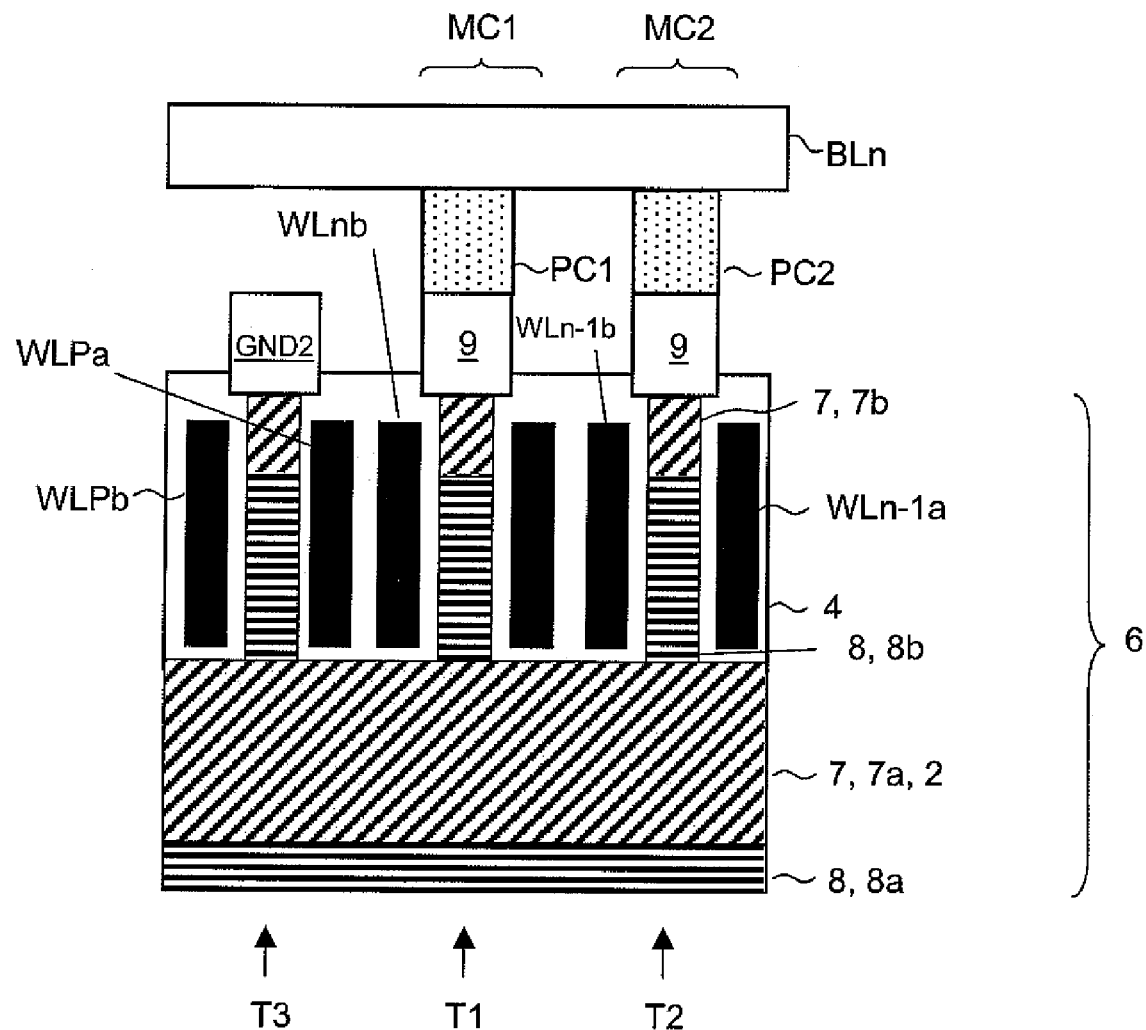
FIG. 10 illustrates a partial cross-section of the array layout of FIG. 9.

FIG. 10 illustrates a cross-section of the array layout according to FIG. 9 along bit line BLn. The arrangement is similar to that of FIG. 4 with the exception that at the ground line GND2 there is lacking a phase change element and instead of a connection region 9 (similar to FIG. 4) the corresponding connection is used as the ground line GND2 such that the ground line GND2 is electrically isolated from the bit line BLn. The areas of the vertical transistors T1, T2, and T3 are indicated by the arrows. The vertical transistors T1, T2, T3 operate in a similar basic manner as described in FIG. 1 to 6.

Figures 11, 12:
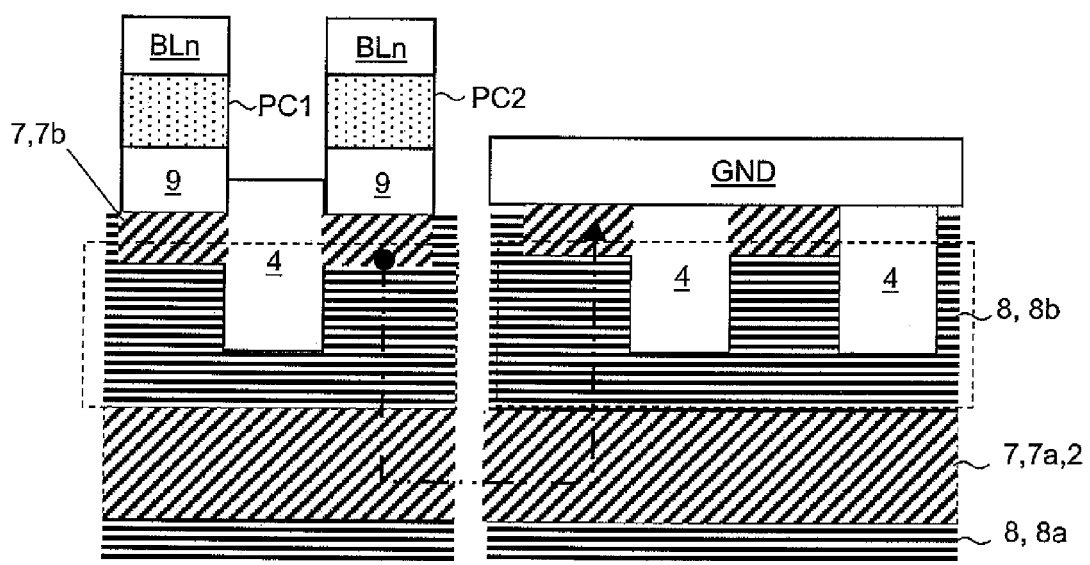
FIG. 11 illustrates another partial cross-section of the array layout of FIG. 9.
FIG. 12 illustrates yet another partial cross-section of the array layout of FIG. 9.

FIGS. 11 and 12 illustrate other respective cross-sections of the array layout according to FIG. 9, namely perpendicular to the bitlines through the switching active areas (FIG. 11) and through the ground line GND2 (FIG. 12).

This arrangement is similar to that of FIG. 6 wherein FIG. 11 corresponds to the right part of FIG. 6 including the phase change elements PC 1, PC2 and the elements of FIG. 12 correspond to the left part of FIG. 6 including the ground line GND. Illustrated by the arrow is a schematic current path.

While the invention has been described by way of example it should be understood that it is not restricted to the described embodiments.

For example, the ground line can be any suitable connection, e.g. a ground line, a ground plate, a ground mesh etc. Also, the switching active material can be a conductive bridging material or a magneto-resistive material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a resistively switching memory comprising:
   a bitline electrode and a second electrode having a lower voltage potential than the bitline electrode;
   a switching active volume and a selection transistor connected in series between the bitline electrode and the second electrode;
   the second electrode is connected, via a connection transistor, to a third electrode having the same or a lower voltage potential than the second electrode; and
   wherein the second electrode comprises a buried electrode at least partially positioned below the bitline electrode and the third electrode.

2. The integrated circuit of claim 1, comprising wherein a wordline is connected to a gate of the selection transistor.

3. The integrated circuit of claim 2, comprising wherein the wordline is connected to a gate of the connection transistor.

4. The integrated circuit of claim 2, comprising wherein another wordline is connected to a gate of the connection transistor.

5. The integrated circuit of claim 1, comprising wherein at least one out of the selection transistor and the connection transistor is a vertical transistor at least partially guiding a substantially vertical current flow.

6. The integrated circuit of claim 1, comprising wherein a further switching active volume and the connection transistor are connected in series between the second electrode and the third electrode.

7. The integrated circuit of claim 1, comprising wherein the bitline electrode and the third electrode are at least partially positioned above a substrate and the second electrode is positioned within the substrate.

8. The integrated circuit of claim 7, comprising wherein the second electrode comprises doped silicon.

9. The integrated circuit of claim 1, comprising wherein a form of at least one out of the second electrode and the third electrode comprises at least one of a group consisting of a plate, a line, and a mesh.

10. The integrated circuit of claim 1, comprising wherein the connection transistor and the selection transistor are at least partially manufactured using the same processes.

11. The integrated circuit of claim 10, comprising wherein a wordline connected to a gate of the connection transistor and a wordline connected to a gate of the selection transistor are manufactured simultaneously.

12. The integrated circuit of claim 1, comprising wherein the switching active volume comprises a phase change element.

13. The integrated circuit of claim 1, comprising wherein the connection transistor is activated when the selection transistor is activated.

14. The integrated circuit of claim 13, comprising wherein the connection transistor is always activated during operation of the memory cell.

15. A memory device comprising:
   a plurality of resistively switching memory cells, each of the resistively switching memory cells comprising:
      a bitline electrode and a second electrode common to the set of memory cells having a lower voltage potential than the bitline electrode;
      a switching active volume and a selection transistor connected in series between the respective bitline electrode and the common second electrode;
      wherein the common second electrode comprises a buried electrode at least partially positioned below each bitline electrode and the third electrode; and
      wherein the common second electrode is connected, via at least one associated connection transistor, to a third electrode having the same or a lower voltage potential than the common second electrode.

16. The memory device of claim 15, comprising wherein a same wordline is connected to a gate of at least one of the selection transistors and a gate of one of the connection transistors.

17. The memory device of claim 15, comprising wherein a same wordline is connected to gates of a plurality of the connection transistors.

18. The memory device of claim 17, comprising wherein the wordline connected to the gates of the plurality of the connection transistors is different from a respective wordline of associated selection transistors, and wherein the respective wordlines of the associated selection transistors are each different wordlines.

19. The memory device of claim 15, comprising wherein at least one out of the selection transistors and the connection transistors is a vertical transistor at least partially having a substantially vertical current flow.

20. The memory device of claim 15, comprising wherein a further switching active volume and the connection transistor are connected in series between the second electrode and the third electrode.

21. The memory device of claim 15, comprising wherein the bitline and third electrodes are positioned above a substrate and the second electrode is positioned within the substrate.

22. The memory device of claim 21, wherein the second electrodes comprises doped silicon.

23. The memory device of claim 15, wherein a form of at least one out of the second electrodes and the third electrodes comprises at least one out a group comprising a plate, a line, and a mesh.

24. The memory device of claim 15, comprising wherein the connection transistors and the selection transistors are at least partially manufactured using the same processes.

25. The memory device of claim 24, comprising wherein the wordlines are manufactured simultaneously.

26. The memory device of claim 15, wherein the switching active volumes comprises phase change elements.

27. The memory device of claim 15, comprising wherein the connection transistors are activated during operation of the selection transistors.

28. The memory device of claim 27, comprising wherein the connection transistors are always activated during operation of the memory device.

29. A method of operating an integrated circuit having a resistively switching memory cell comprising:
 a bitline electrode and a second electrode having a lower voltage potential than the bitline electrode;
 a switching active volume and a selection transistor connected in series between the bitline electrode and the second electrode;
 wherein the second electrode is connected, via a connection transistor, to a third electrode having the same or a lower voltage potential than the second electrode;
wherein the second electrode comprises a buried electrode at least partially positioned below the bitline electrode and the third electrode,
wherein the method comprises:
 activating the selection transistor to allow a current flow between the bitline electrode and the second electrode through the switching active volume;
 activating the connection transistor such that it selectively allows a current flow between the second and third electrodes;
 such that, by simultaneously activating the selection transistor and the connection transistor, a current can flow from the bitline electrode to the third electrode.

30. The method of claim 29, wherein simultaneously activating the selection transistor and the connection transistor comprises permanently activating the connection transistor.

31. The method of claim 30, comprising wherein the activating of the selection transistor and the active connection is performed by a same wordline.

32. The method of claim 30, comprising wherein the activating of the selection transistor and the active connection is performed by different wordlines.

33. The method of claim 30, comprising wherein a current through the transistors is flowing at least partially in a substantially vertical manner.

34. A method of operating a memory device comprising a plurality of resistively switching memory cells, each of the resistively switching memory cells comprising:
 a bitline electrode and a second electrode common to the set of memory cells having a lower voltage potential than the bitline electrode;
 a switching active volume and a selection transistor connected in series between the respective bitline electrode and the common second electrode;
 wherein the common second electrode is connected, via at least one associated connection transistor, to a third electrode having the same or a lower voltage potential than the common second electrode;
 wherein the common second electrode comprises a buried electrode at least partially positioned below each bitline electrode and the third electrode,
 wherein the method comprises:
 activating the selection transistor of one of the memory cells to allow a current flow between the bitline electrode and the common second electrode through the active volume;
 activating the connection transistor of one of the memory cells such that the connection transistor selectively allows a current flow between the second and third electrodes;
 such that by simultaneously activating the selection transistor and the connection transistor of one of the memory cells a current can flow from the bitline electrode to the third electrode.

35. The method of claim 34, comprising simultaneously activating the selection transistor and the connection transistor comprises permanently activating the connection transistor.

36. The method of claim 34, comprising performing the activating of the selection transistor and the active connection by a same wordline.

37. The method of claim 34, comprising performing the activating of the selection transistor and the active connection by different wordlines.

38. The method of claim 34, comprising wherein a current through the transistors is flowing at least partially in a substantially vertical manner.

39. A resistively switching memory cell of a memory device, the resistively switching memory cell comprising:
 a first electrical connection means and a second electrical connection means having a lower voltage potential than the first electrical connection means;
 a switching active means and a selection means for selectively allowing a current flowing through it connected in series between the fist electrical connection means and the second electrical connection means;
 wherein the second electrical connection means is connected, via a connection means for selectively allowing a current flowing through it, to a third electrical connection means having the same or a lower voltage potential than the second electrical connection means;

wherein the second electrical connection means comprises a buried electrode at least partially positioned below the first electrical connection means and the third electrical connection means.

40. The memory cell of claim 39, comprising wherein an electrical control means is connected to a control input of the selection means.

41. The memory cell of claim 39, comprising wherein the same electrical control means is connected to a control input of the connection means.

42. The memory cell of claim 39, comprising wherein a further electrical control means is connected to a control input of the connection means.

* * * * *